(12) United States Patent
Armani

(10) Patent No.: US 11,589,424 B2
(45) Date of Patent: Feb. 21, 2023

(54) DEVICE FOR REGENERATING ELECTRONIC COMPONENTS IN A NUCLEAR ENVIRONMENT

(71) Applicant: COMMISSARIAT A L'ENERGIE ATOMIQUE ET AUX ENERGIES ALTERNATIVES, Paris (FR)

(72) Inventor: Jean-Marc Armani, Montigny le Bretonneux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 11 days.

(21) Appl. No.: 16/628,658

(22) PCT Filed: Jul. 9, 2018

(86) PCT No.: PCT/EP2018/068516
§ 371 (c)(1),
(2) Date: Jan. 3, 2020

(87) PCT Pub. No.: WO2019/011845
PCT Pub. Date: Jan. 17, 2019

(65) Prior Publication Data
US 2020/0154523 A1    May 14, 2020

(30) Foreign Application Priority Data
Jul. 12, 2017   (FR) ........................................ 1756630

(51) Int. Cl.
*H05B 3/00*   (2006.01)
*G05D 23/24*   (2006.01)
(Continued)

(52) U.S. Cl.
CPC ....... *H05B 3/0019* (2013.01); *G05D 23/2451* (2013.01); *G05F 3/265* (2013.01); *G05F 3/30* (2013.01)

(58) Field of Classification Search
None
See application file for complete search history.

(56) References Cited

U.S. PATENT DOCUMENTS 3,956,713 A    5/1976  Ogawara
4,807,470 A *  2/1989  Kleinhans ............. G01F 1/6986
                                                73/204.15
(Continued)

FOREIGN PATENT DOCUMENTS

| EP | 0 634 835 A2 | 1/1995 |
| FR | 3 034 947 A1 | 10/2016 |
| GB | 2 200 520 A | 8/1988 |

*Primary Examiner* — Thomas J. Hiltunen
(74) *Attorney, Agent, or Firm* — BakerHostetler

(57) ABSTRACT

The device includes at least the following components: a heating resistor intended for heating a component to be regenerated; a current source; a thermistor connected to the current source and thermally coupled to the heating resistor, the thermistor, through which the current flows, having a voltage Vtemp across its terminals, which voltage reflects the temperature of the heating resistor; an error amplifier, which amplifies the difference between the voltage Vset and the voltage Vtemp and delivers a voltage Vctrl that corresponds to the amplified difference; a switch, which switches the current flowing through the heating resistor; an oscillator, which delivers a voltage Vosc formed with a modulated duty cycle, the duty cycle of the pulses of the voltage Vosc being dependent on the voltage Vctrl, the pulses controlling the opening of the switch.

13 Claims, 3 Drawing Sheets

(51) Int. Cl.
*G05F 3/26* (2006.01)
*G05F 3/30* (2006.01)

(56) References Cited

U.S. PATENT DOCUMENTS

| | | | | |
|---|---|---|---|---|
| 4,910,388 | A * | 3/1990 | Lorenz | H05B 3/36 219/543 |
| 4,985,687 | A * | 1/1991 | Long | H03L 1/04 331/70 |
| 5,075,537 | A * | 12/1991 | Lorenzen | G01R 31/50 219/497 |
| 5,150,611 | A * | 9/1992 | Kleinhans | G01F 1/6986 73/204.14 |
| 5,193,388 | A * | 3/1993 | Kleinhans | F02D 41/187 73/204.14 |
| 5,256,860 | A | 10/1993 | Newman et al. | |
| 5,519,190 | A * | 5/1996 | Aoki | G03G 15/2003 219/497 |
| 5,582,757 | A * | 12/1996 | Kio | H05B 3/145 219/548 |
| 5,998,973 | A * | 12/1999 | Tsai | H01M 10/44 320/135 |
| 6,215,302 | B1 | 4/2001 | Carey | |
| 7,387,022 | B1 * | 6/2008 | Korniyenko | G01F 1/6842 73/204.11 |
| 7,481,574 | B2 * | 1/2009 | Ariyoshi | G01F 1/6845 374/11 |
| 7,617,723 | B2 * | 11/2009 | Matsumoto | G01F 1/6845 73/204.26 |
| 8,183,940 | B2 * | 5/2012 | Koyama | G05D 23/24 331/69 |
| 8,731,801 | B2 * | 5/2014 | Mowery | F02M 53/06 701/103 |
| 8,916,799 | B2 * | 12/2014 | Martinez | H05B 3/84 219/520 |
| 10,221,817 | B2 * | 3/2019 | Tonkin | F02M 31/13 |
| 10,724,882 | B2 * | 7/2020 | Reichart | G01F 1/6986 |
| 10,826,133 | B2 * | 11/2020 | White | H01M 10/6571 |
| 2005/0083030 | A1 | 4/2005 | Ito et al. | |
| 2005/0120789 | A1 * | 6/2005 | Matsumoto | G01F 1/699 73/204.15 |
| 2010/0017159 | A1 * | 1/2010 | Burke | A61B 2/087 702/81 |
| 2020/0045773 | A1 * | 2/2020 | Liu | H05B 1/0225 |

* cited by examiner

DEVICE FOR REGENERATING ELECTRONIC COMPONENTS IN A NUCLEAR ENVIRONMENT

CROSS-REFERENCE TO RELATED APPLICATIONS

This application is a National Stage of International patent application PCT/EP2018/068516, filed on Jul. 9, 2018, which claims priority to foreign French patent application No. FR 1756630, filed on Jul. 12, 2017, the disclosures of which are incorporated by reference in their entirety.

FIELD OF THE INVENTION

The present invention relates to a device for regenerating electronic components exposed to ionizing radiation, in particular in a nuclear environment, by heating them.

BACKGROUND

It is known that electronic CMOS components are sensitive to ionizing radiation and that their electrical characteristics degrade after prolonged exposure. This degradation is a result of the build-up of charges in the insulating materials of the semiconductor, which leads to malfunctioning of the elementary transistors. These trapped charges are released over different timescales through heat emission and/or tunneling. A high-temperature thermal anneal therefore allows CMOS components to be regenerated to varying degrees of completeness depending on the heating parameters. The anneal is generally applied cyclically, the regenerated component having a long operating life relative to the heating time.

A precise temperature controller is essential for controlling the heating of the component during regeneration. Firstly, the requisite high temperatures have to be controlled to within a degree in order to achieve the levels of energy for activating the trapped charges that are aimed for in the regeneration. Secondly, it is essential for the temperature to remain stable throughout the regeneration and not to get out of control despite the irradiation, so as not to endanger the component being heated. Temperature adjustment is necessary in order to be able to adapt to the various types of components to be regenerated. Moreover, it is essential to control the temperature setpoint, which, in addition, has to be adapted to each type of component as mentioned above.

Temperature control devices are generally:
either designed to be very precise by virtue of the use of complex electronic components (analog-to-digital and digital-to-analog converters, microcontrollers, operational amplifiers, integrated voltage references, etc.);
or designed in a basic fashion with just a few components so as to be sturdy but not very precise.

Complex solutions may present problems with respect to integration in built-in items of equipment, and simple solutions may not perform well enough for an application requiring precision. Finally, these devices are not typically intended for withstanding nuclear environments.

In this type of environment, the power-generation and heating-control system may, for the sake of simplicity, be moved to a non-radioactive zone for reasons of resistance to radiation. However, there are a number of drawbacks to this move:
a larger number of wires in the cable;
possible control instability;
lower reliability: if the connection is broken (damaged cable), the regeneration no longer takes place;
the heating power possibly being limited by resistive losses.

SUMMARY OF THE INVENTION

An aim of the invention is in particular to address the overall issue set out above by allowing local control of the regeneration temperature of electronic components in a precise manner in a built-in item of equipment exposed to radiation while controlling the temperature setpoint, which is set on the basis of the type of component to be regenerated.

To this end, the subject of the invention is a device for regenerating electronic components exposed to ionizing radiation by heating them, said device comprising at least the following components:
a heating resistor intended for heating a component to be regenerated;
a current source;
a thermistor connected to said current source and thermally coupled to said heating resistor, said thermistor, through which said current flows, having a voltage Vtemp across its terminals, which voltage reflects the temperature of said heating resistor;
an error amplifier, which amplifies the difference between the voltage Vset and the voltage Vtemp and delivers a voltage Vctrl that corresponds to said amplified difference;
a switch, which switches the current flowing through said heating resistor;
an oscillator, which delivers a voltage Vosc formed with a modulated duty cycle, the duty cycle of the pulses of said voltage Vosc being dependent on the voltage Vctrl, said pulses controlling the opening of said switch.

In one particular mode of implementation, said device comprises a setpoint module that delivers an adjustable voltage Vset, which reflects the heating setpoint temperature selected for said heating resistor.

Said components are, for example, embodied as discrete electronic components.

In another possible embodiment, said device comprises a voltage regulator supplying a stabilized supply voltage to said current source, said amplifier and said setpoint module.

Said device comprises, for example, a safety circuit formed by a transistor Q1, a resistor Rlim and a potentiometer Plim, the resistor Rlim and the potentiometer Plim being connected in the form of a divider bridge to a stabilized voltage Vreg supplied to said oscillator, the center tap of said bridge being connected to the base of the transistor Q1, the emitter of the transistor Q1 being connected to the input of said oscillator that receives the voltage Vctrl, and the collector being connected to said stabilized voltage Vreg.

Said switch comprises, for example, two bipolar transistors Q3, Q4 and resistors R7, R8, R9, R10, said transistors being put together such that when Q3 is on, Q4 is on, the base of Q4 being connected to the collector of the transistor Q3 via the resistor R9, the resistor R10 being connected between the emitter and the base of Q4, the emitter of Q4 being directly connected to a supply voltage Vcc, and the collector thereof being directly connected to said heating resistor, the emitter of Q3 being connected to electrical ground, and the base thereof being connected to the center tap of a voltage divider composed of the resistors R7 and R8, the resistor R7 being connected to the output of said oscillator that delivers the voltage Vosc, and the resistor R8 being connected to electrical ground.

Said current source comprises for example:
a balanced current mirror comprising four bipolar transistors, forming a full Wilson mirror;
a resistor R6;
a resistor Rshunt;
and a resistor Rbias1;
the four transistors together forming two simple current mirrors M1, M2 that are cascaded and cross-coupled such that the base currents of the transistors tend to cancel each other out, the emitters of the transistors of the first mirror M1 being able to be connected to a regulated voltage Vreg, the output of the second mirror M2 being connected to the resistor Rshunt, which is connected to the resistor of said thermistor (10), and to the resistor Rbias1, which is connected to electrical ground, the resistor R6 connecting the emitters of the transistors of the first mirror M1 to their common base.

The resistance value of the resistor R6 is, for example, approximately half the resistance value of the resistor Rbias1.

Said amplifier comprises, for example, at least:
a first differential pair DP2 comprising complementary bipolar transistors, which forms a first amplification stage and receives the voltage Vtemp at the base of one transistor and the voltage Vset at the base of the other transistor; a current mirror M4, which fixes the bias current of DP2;
a second differential pair DP1 comprising complementary bipolar transistors, which forms a second amplification stage, the base of a first transistor of DP1 being connected to the collector of a first transistor of DP2, and the base of the second transistor of DP1 being connected to the collector of the second transistor of DP2;
a current mirror M3, which fixes the bias current of DP1;
a bipolar transistor Q2, which forms the third amplification stage, the base of Q2 being connected to the collector of one transistor of DP1, the collector of Q2 being able to be connected to a regulated voltage Vreg, the voltage Vctrl being present at the output of the emitter of Q2.

Said amplifier comprises, for example, resistors R1, R2, R3, R4, R5 and resistors Rbias2, Rbias3, the emitters of the transistors of the current mirror M3 being able to be connected to the regulated voltage Vreg, the collector of one transistor of the mirror M3 being connected to the resistor Rbias2, and the collector of the other transistor of the mirror M3 being connected to the emitters of the transistors of the first differential pair DP1, the collectors of the mirror M3 being connected to ground via the resistors R3 and R4, the emitters of the mirror M4 being connected to ground, one collector of said mirror M4 being able to be connected to the regulated voltage Vreg via the resistor Rbias3, and the other collector being connected to the emitters of the differential pair DP2, the collectors of DP2 being connected to the regulated voltage Vreg, one via the resistor R1 and the other via the resistor R2, the collector of the transistor Q2 being able to be connected to the regulated voltage Vreg, the emitter of Q2 being connected to ground via the resistor R5.

Said oscillator comprises, for example, bipolar transistors Q5, Q6, Q7, Q8, resistors R11, R12, R13, R14, R15, R16, R17, R18, R19, R20, R21 and a capacitor C1, which are put together to form a relaxation oscillator, the free-running oscillation frequency being determined by the resistor R12 connected between said capacitor C1 and the emitter of Q8, which forms the output of said oscillator;

the charging current of the capacitor C1 being controlled so as to modulate the duty cycle of the voltage Vosc delivered at the output of said oscillator, said charging current being supplied by the voltage Vctrl via the resistor R11, said oscillator being powered by a regulated voltage Vreg to which are connected the resistors R13, R14, R15, which are connected to the collector of Q5, Q6 and Q7, respectively, and the collector of the transistor Q8;

the transistors Q5 and Q6 and the resistors R13, R14, R16, R17 and R19 forming a Schmitt trigger-type flip-flop, the signal across the terminals of said capacitor C1 being sent to the base of the transistor Q5 that constitutes the input of said flip-flop;

the output of said flip-flop, formed by the collector of Q6, being sent to an inverter formed by the transistor Q7 and the resistors R15, R18 and R20, R18 being connected between the base of Q7 and the collector of Q6, and R20 being connected between said base and electrical ground;

the inverted signal being taken from the collector of the transistor Q7 and being sent to an impedance-matching stage composed of the transistor Q8, connected up as a follower, and the resistor R21, the transistor Q8 and the resistor R21 being configured in common-collector arrangement.

Said device comprises, for example, an output that supplies a signal VTout that copies the voltage across the terminals of said thermistor.

The device according to the invention advantageously allows the precision of the temperature control to be improved in comparison with solutions that operate on an on/off basis, for which the temperature can vary very significantly relative to the desired value.

BRIEF DESCRIPTION OF THE DRAWINGS

Other features and advantages of the invention will become apparent from the description below, provided with reference to appended drawings, in which.

DETAILED DESCRIPTION

Figure 1:
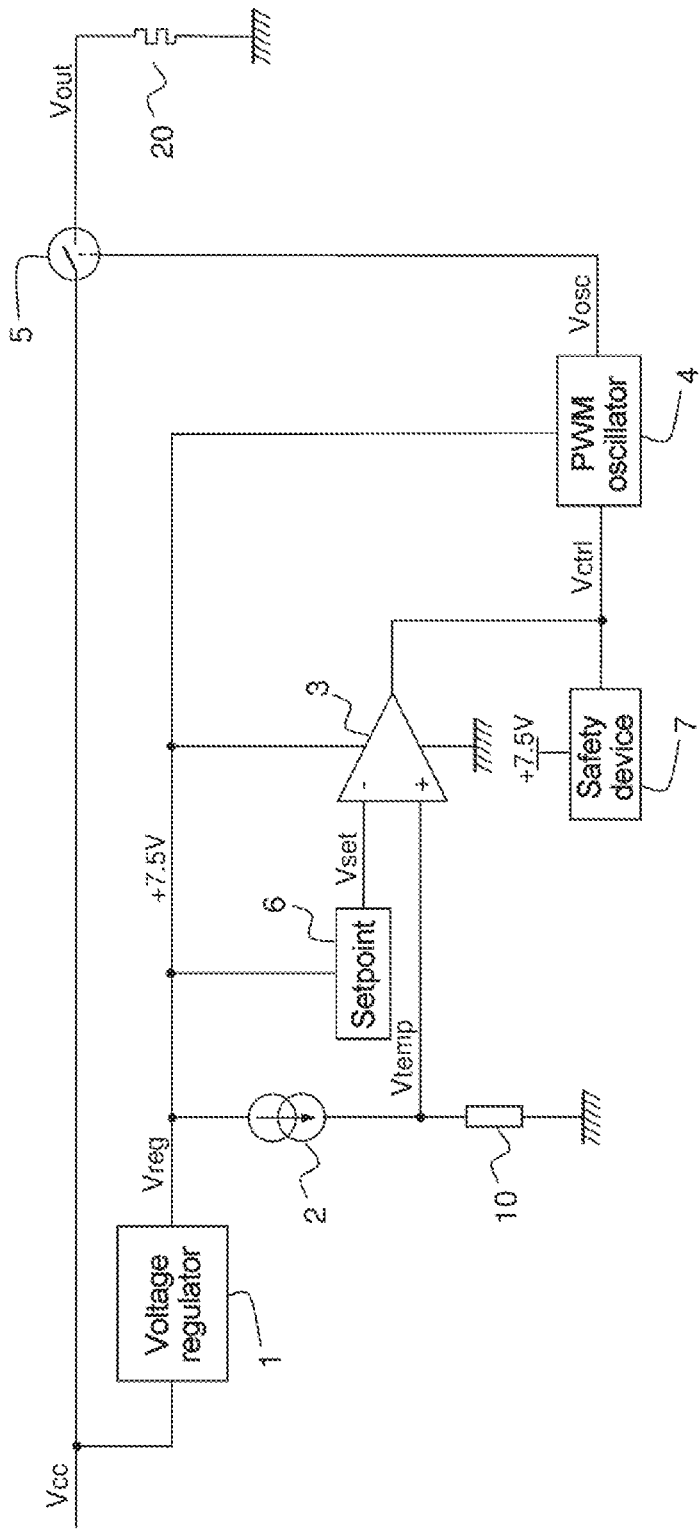
FIG. 1 shows an exemplary block diagram of the invention.

FIG. 1 shows an exemplary block diagram of the invention. In this diagram, the device comprises the following components:
a voltage regulator 1, which forms a stabilized power supply;
a precision current source 2;
a high-gain error amplifier 3;
an oscillator 4 controlled by modulating the duty cycle of its pulses, which modulation is known as PWM;

a module 6 for setting the setpoint temperature, embodied as a resistor bridge, for example;

a thermal safety system 7;

a thermistor-type temperature sensor 10;

a heating resistor 20 intended for heating the component to be regenerated;

a switch 5, which switches the current flowing through the heating resistor.

The operation of the device of FIG. 1 and the function of the components listed above will be described below.

The temperature sensor 10, represented by its resistor, and the heating resistor 20 are together thermally connected to the component to be regenerated. A thermally conductive and electrically insulating composite adhesive can be used to realize this thermal coupling. In order to carry out this thermal coupling to the component to be regenerated, the sensor 10 and the heating resistor 20 are spaced apart from all the other components of the device.

The device according to the invention is supplied with a DC input voltage Vcc, which is, for example, equal to a nominal value of 12 V. The voltage regulator 1 converts this voltage into a regulated voltage Vreg, which is, for example, equal to 7.5 V. This regulated voltage is supplied to the current generator 2, the error amplifier 3, the bridge 6 for setting the temperature, the thermal safety device 7 and the modulated oscillator 4. The heating-current switch 5, for its part, is directly supplied with the unregulated input voltage Vcc. The regulator according to the invention is produced using discrete components such as transistors, diodes, resistors and capacitors in order to ensure a high resistance to radiation. This regulator allows the variations in the input voltage Vcc to be eliminated, with a precise voltage being supplied at the output.

The current source 2 supplies the temperature sensor 10 with a stable and precise current. This allows the temperature to be derived directly from the voltage Vtemp measured across the terminals of said sensor.

The module 6 for setting the setpoint allows the control temperature to be fixed. It sends this setpoint to the error amplifier 3 in the form of a voltage Vset.

The error amplifier 3 in particular has the function of amplifying the difference between the setpoint voltage Vset and the voltage Vtemp across the terminals of the sensor. It supplies an amplified error signal Vctrl to the thermal safety circuit 7 and to the modulated oscillator 4.

This oscillator 4 allows the power sent to the heating resistor 20 to be varied by adjusting the duty cycle of the voltage applied or of the current flowing through this resistor. It sends a control signal Vosc to the switch 5.

The thermal safety device 7 provides for protection of the component to be regenerated by limiting the heating temperature to a preset maximum value.

The heating-current switch 5 chops (or switches) the current taken from the unregulated power supply Vcc to send it to the heating resistor 20.

The various functions of the device are realized on the basis of discrete components, since this allows control to be had over the selection and configuration of these components in order to define an architecture capable of ensuring high resistance to radiation. In particular, the transistors may be selected from the range of discrete bipolar models, which are more resistant to radiation than discrete MOSFETs.

Figure 2:
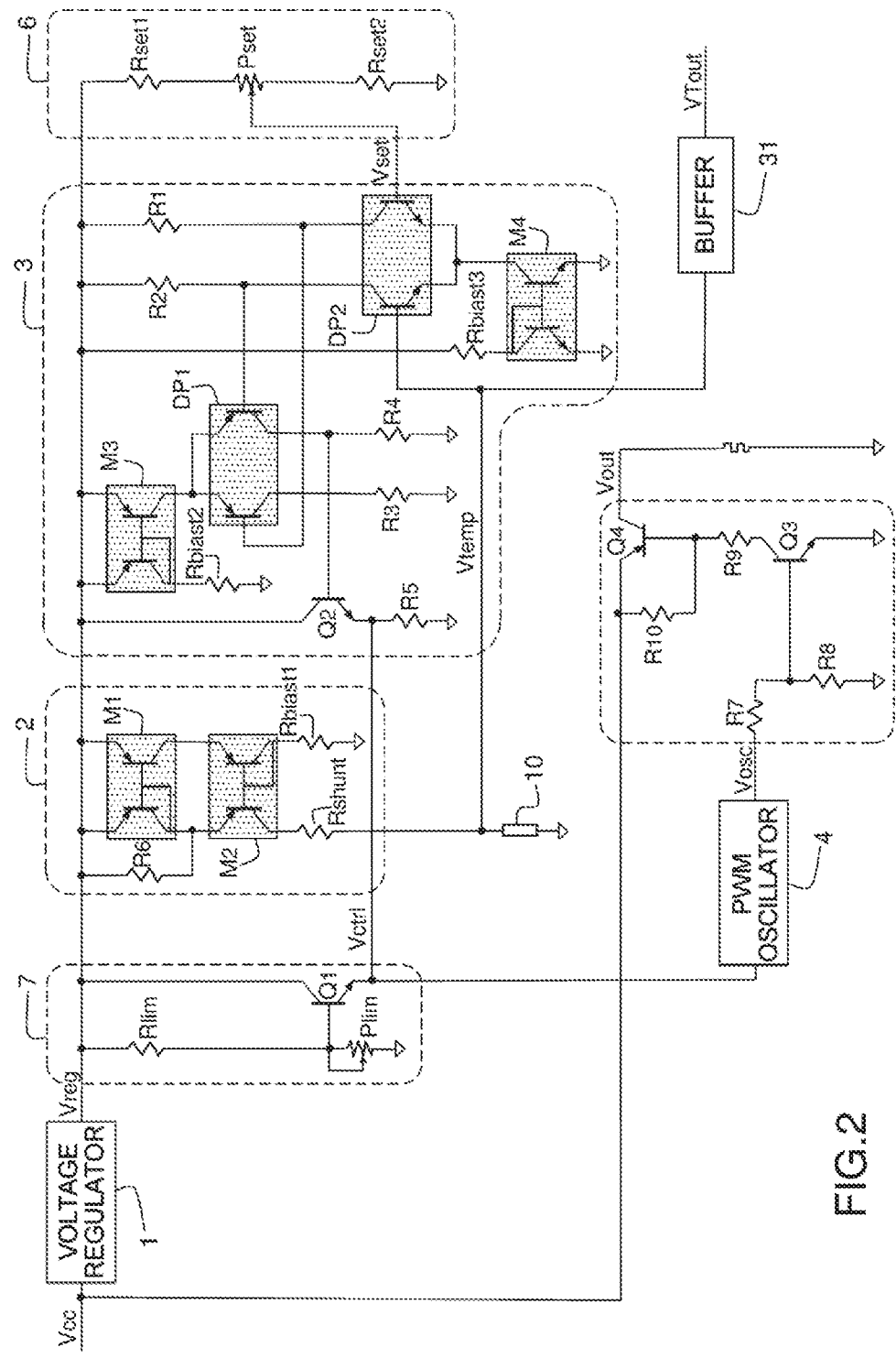
FIG. 2 shows an exemplary embodiment of a device according to the invention.

FIG. 2 shows an exemplary embodiment of a device according to the invention. This figure shows the various elements set out in FIG. 1 in detail. The various components that make up the device according to the invention will now be described in more detail.

The setpoint temperature is fixed by means of a resistive bridge 6 made up of a resistor Rset1, a potentiometer Pset and another resistor Rset2. The lower leg of the divider bridge is connected to the ground of the circuit, and the setpoint signal Vset present at the wiper of the potentiometer Pset is sent to an input of the error amplifier 3. An operator can set the setpoint temperature by acting on the potentiometer either directly or via any interface known elsewhere. It is thus possible to replace the resistive bridge with a controlled voltage generator, for example. Vset is also adjusted on the basis of the characteristics of the temperature sensor 10 used.

The resistance value of the three elements Rset1, Pset, Rset2 is selected such that the current flowing through the branch that delivers the setpoint voltage VSet is negligible. In this case, the voltage Vset is given by the following equation:

$$Vset = Vreg * \frac{Rset2 + \alpha * Pset}{Rset1 + Pset + Rset2}$$

The parameter $\alpha$ represents the division ratio of the potentiometer Pset for a given setting. The resistors Rset1 and Rset2 allow the range of adjustment of the setpoint temperature to be limited.

The current generator 2 is a precision current generator that is insusceptible to the temperature variations and technological variations caused by the process for manufacturing the components (transistors in pairs M1 and M2). It is built around a balanced current mirror comprising four bipolar transistors, forming a full Wilson mirror. To this end, the four transistors together form two simple current mirrors M1, M2 that are cascaded and cross-coupled such that the base currents of the transistors tend to cancel each other out. The emitters of the transistors of the first mirror M1 are connected to the regulated voltage Vreg. The output of the second mirror M2 is connected to a resistor Rshunt, which is connected to the resistor of the temperature sensor 10, and to a resistor Rbias1, which is connected to ground. More specifically, the collector of one transistor is connected to Rshunt, and the collector of the other transistor is connected to Rbias1. A resistor R6 connects the emitters of the transistors of the first mirror M1 to their common base.

The transistors of these simple mirrors are paired two by two, and each pair is integrated, for example, in a common housing in order to ensure effective thermal coupling. It is also possible to use groups of four identical transistors in the same housing in order to further improve thermal performance. To a first approximation, if all the transistors of the first mirror M1 and of the second mirror M2 are considered to be identical, the measurement current/sensor for measuring the resistance of the temperature sensor 10 is equal to the current flowing through the resistor Rbias1 and is given by the following equation:

$$Isensor = \frac{Vreg - Vbe(M1) - Vbe(M2)}{Rbias1} + \frac{Vbe(M1)}{R6}$$

Vbe(M1) and Vbe(M2) represent the voltage between the base and the emitter of the transistors of the mirrors M1 and M2, respectively.

The resistor R6 allows variations in the measurement current when the ambient temperature changes to be partially compensated for. To this end, the resistance value of the resistor R6 has to be half that of the resistor Rbias1. If all the transistors are considered to be identical, the above equation then becomes:

$$Isensor = \frac{Vreg + Vbe(M1) - Vbe(M2)}{Rbias1} \approx \frac{Vreg}{Rbias1}$$

The measurement current is therefore fundamentally independent of the temperature. In order not to cause any self-heating of the sensor that could lead to an error, the measurement current is fixed at a value such that the power dissipated in said sensor remains sufficiently low (less than a few mW). The resistor Rshunt allows the measurement current to be measured without the sensor having to be disconnected in order to adjust the intensity of said current using Rbias1.

The error amplifier 3 comprises differential pairs DP1, DP2 comprising complementary bipolar transistors, current mirrors M3, M4 comprising complementary bipolar transistors, a bipolar transistor Q2, resistors R1, R2, R3, R4, R5 and resistors Rbias2, Rbias3.

The emitters of the transistors of the first current mirror M3 are connected to the regulated voltage Vreg. The collector of one transistor is connected to the resistor Rbias2, and the collector of the other transistor is connected to the emitters of the transistors of the first differential pair DP1, the collectors being connected to ground via the resistors R3 and R4.

The current mirror M3 is thus connected in such a way that it fixes the bias current of the pair DP1. This allows the precision of the temperature control to be improved by enhancing common-mode rejection.

If the two transistors of M3 are assumed to be identical, the current IbiasDP1 supplied by M3 to the pair DP1 is given by the following equation, which is the basic equation for a current mirror:

$$IbiasDP1 = \frac{Vreg - Vbe(M3)}{Rbias2 * \left[1 + \frac{2}{\beta(M3)}\right]}$$

Vbe(M3) represents the base-emitter voltage of the transistors of the mirror M3.

β(M3) is the static current gain of the transistors of the mirror.

The second current mirror M4 and the second differential pair DP2 are connected in a similar manner. In this arrangement, the emitters of the mirror M4 are connected to ground, one collector is connected to the regulated voltage Vreg via the resistor Rbias3, and the other collector is connected to the emitters of the differential pair DP2. The collectors of this pair DP2 are connected to the regulated voltage, one via the resistor R1 and the other via the resistor R2.

The differential pair DP2 constitutes the first amplification stage; it receives the voltage Vtemp at the base of one transistor and the voltage Vset at the base of the other transistor.

The differential pair DP1 constitutes the second amplification stage. To this end, the base of the first transistor of DP1 is connected to the collector of the first transistor of DP2, and that the base of the second transistor of DP1 is connected to the collector of the second transistor of DP2.

The transistor Q2 constitutes the third amplification stage, to which end the base of Q2 is connected to the collector of one transistor of DP1. The collector of Q2 is connected to the regulated voltage Vreg and the emitter thereof is connected to ground via the resistor R5.

Given that the current mirror M4 and the differential pair DP2 are connected in a similar manner, the same form of equation can be used to calculate the current IbiasDP2 supplied to DP2 by M4.

The differential gain of the pair DP1 is fixed by the quiescent current IbiasDP1 and also the resistors R1 and R2. If R1 and R2 are given an identical resistance value denoted RC1, Ie differential gain Avdif (DP1) is given by the following equation:

$$Avdif(DP1) = gm(DP1) * RC1 = \frac{IbiasDP1 * RC1}{2 * VT}$$

gm(DP1) is the transconductance of the transistors of DP1, VT is the thermal potential of the transistor, which is approximately 26 mV at 300 K. The same form of expression can be used to calculate the differential gain of the pair DP2. Since the voltage is taken from the pair DP2 in common mode rather than differential mode, it is necessary to consider the common-mode gain Avcom(DP2), which is equal to the differential gain divided by 2.

The total open-loop gain of the error amplifierAv(Amplifier) depends on the contribution of the three stages DP2, DP1 and Q2, and is therefore equal to Avdif(DP1)*AVcom (DP2)*Av(Q2).

If the gain Av(Q2) of Q2 is taken to be approximately 1, and if losses are disregarded, the expression can be written as follows:

$$Av(Amplifier) = \frac{gm(DP1) * RC1 * gm(DP2) * RC2}{2}$$

RC2 is the resistance value of the resistors R3 and R4.

The gain of the error amplifierAv(Amplifier) is preferably configured with a high value in order for the closed-loop error to be minimal.

The output of the error amplifier is the emitter of the transistor Q2, which supplies a control voltage Vctrl. This voltage is sent to the oscillator 4, the duty cycle of which can be modulated (PWM). The PWM allows the heating up of the transistors of the switch 5, which operate in off/saturation mode, to be kept to a minimum. It provides for precise temperature control by virtue of the continuous variation of the power sent to the heating resistor 20 (Rheat). This power is linearly dependent on the duty cycle of the signal at the output of the oscillator, according to the expression:

$$Pheat = \frac{Vcc^2}{Rheat} * Dcycl$$

Dcycl is the duty cycle of the signal at the output of the oscillator and corresponds to the quotient of the pulse width over the period. If the oscillator has a linear transfer function, the power also varies linearly with respect to the voltage Vctrl.

Figure 3:
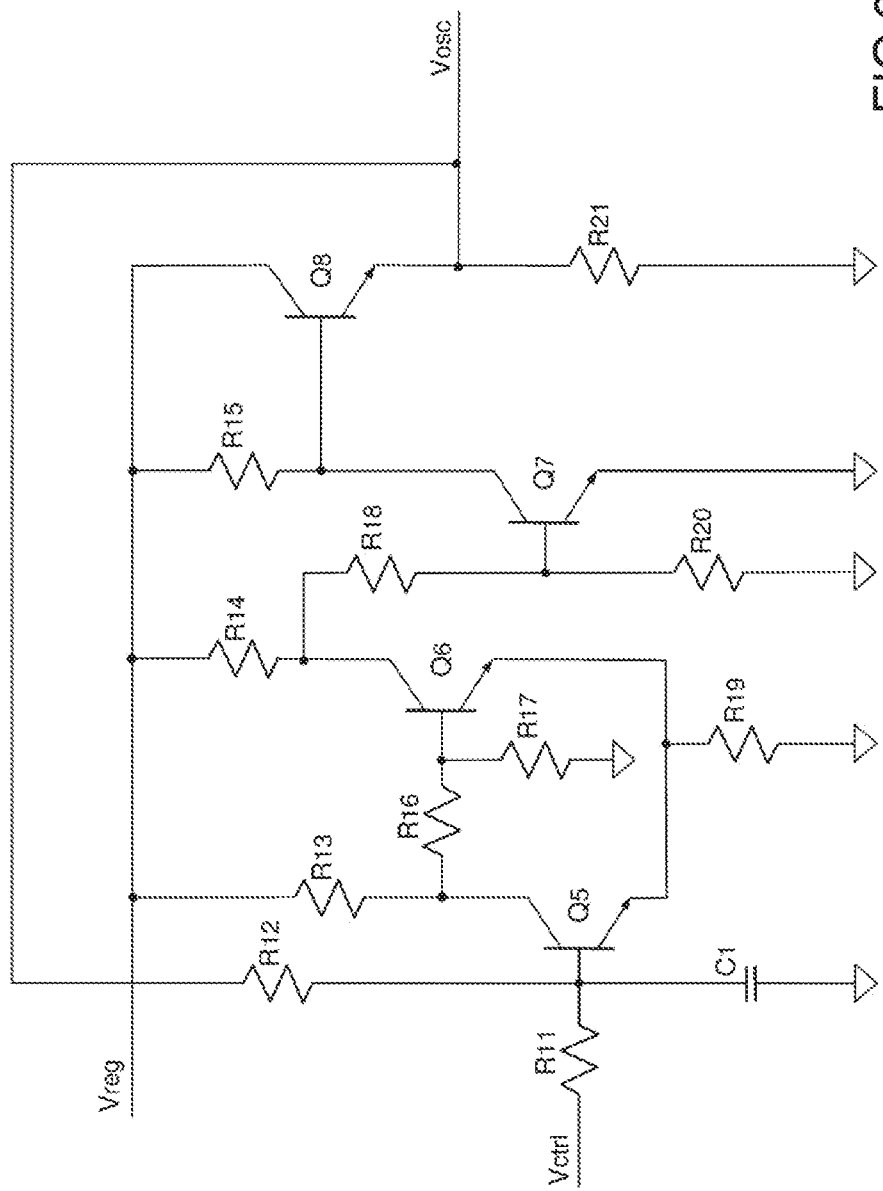
FIG. 3 shows an exemplary embodiment of a PWM-type oscillator used in a device according to the invention.

FIG. 3 shows an exemplary embodiment of this oscillator. Other implementations comprising more or fewer components are possible.

This exemplary embodiment comprises four bipolar transistors Q5, Q6, Q7, Q8, ten resistors R11 to R21 and a capacitor C1. The elements are put together to form a relaxation oscillator, the charging current of the capacitor C1 of which is controlled so as to modulate the duty cycle at the output of the oscillator. The voltage Vosc delivered at the output is thus modulated by varying the duty cycle thereof. The charging current of the capacitor C1 is controlled by the voltage Vctrl via the resistor R11.

The oscillator is supplied with the regulated voltage Vreg to which are connected the resistors R13, R14, R15 (which are connected to the collector of Q5, Q6 and Q7, respectively) and the collector of the transistor Q8.

The free-running oscillation frequency is dictated by the resistor R12 and the capacitor C1. This frequency can easily be fixed at several tens of kilohertz.

The transistors Q5 and Q6, along with the resistors R13, R14, R16, R17 and R19, form a Schmitt trigger flip-flop. The thresholds of this flip-flop are fixed so as to reduce the risk of oscillation of the temperature control loop.

The signal across the terminals of the capacitor C1 is sent to the base of the transistor Q5 that constitutes the input of this trigger flip-flop. The output of this flip-flop, taken from the collector of Q6, is sent to an inverter formed by the transistor Q7 and the resistors R15, R18 and R20. The resistor R20 connected as the lower leg of the bridge R18/R20 allows the switching of the transistor Q7 to be improved (R18 being connected between the base of Q7 and the collector of Q6, and R20 being connected between said base and ground).

The inverted signal is taken from the collector of the transistor Q7 and is sent to an impedance-matching stage composed of the transistor Q8, connected up as a follower, and the resistor R21, the transistor Q8 and the resistor R21 being configured in common-collector arrangement. The output of the oscillator Vosc is taken from the emitter of Q8 and fed back to the input via the resistor R12 in order to create sustained oscillation.

When the input Vctrl is disconnected, the oscillator supplies a signal with an average duty cycle. When a voltage is applied to the input Vctrl, the charging and discharging times of the capacitor C1 will be altered by the value of this voltage, which will lead to the duty cycle of the output Vosc being altered. The arrangement is configured such that when Vctrl increases, the duty cycle of Vosc decreases.

The signal Vosc originating from the output of the modulated oscillator is used to control the switch 5 for the current sent to the heating resistor 20.

The switch is composed of two bipolar transistors Q3, Q4 and also resistors R7, R8, R9, R10. The transistors are put together such that when Q3 is on, Q4 is on too. Q4 is a PNP power transistor which, by virtue of its characteristics, allows the heating current required for regeneration to flow through it. It has a saturation voltage that is low when the collector current is high. The base of said transistor is connected to the collector of the NPN transistor Q3 via the resistor R9. Said resistor must have a resistance value that is low enough to ensure effective saturation of Q4, even when the heating current has a high intensity. The resistor R10 placed between the emitter and the base of Q4 allows the switching of Q4 to be improved. The emitter of Q4 is directly connected to the voltage Vcc, and the collector thereof is directly connected to the heating resistor. The emitter of Q3 is connected to ground, and the base thereof is connected to the center tap of a voltage divider composed of the resistors R7 and R8. The resistor R7 connected to the output of the oscillator fixes the base current of Q3, and the resistor R8 allows the switching operations of Q3 to be improved.

In order to protect the component to be regenerated, a safety circuit 7 for the heating temperature is, for example, provided. The protection circuit is formed by a transistor Q1, a resistor Rlim and a potentiometer Plim.

The resistor Rlim and the potentiometer Plim are connected in the form of a divider bridge to the regulated voltage Vreg. The center tap of this bridge is connected to the base of Q1. The resistance values of Rlim and Plim are selected such that the current flowing through the base of Q1 is negligible. The emitter of Q1 is connected to the signal Vctrl (more specifically to the output of the amplifier 3 and to the input of the oscillator 4), and the collector thereof is connected to the voltage Vreg. This circuit 7 allows the maximum temperature controllable by the invention to be limited. For this purpose, it acts on the voltage Vctrl by preventing it from falling below a value determined by the setting of Plim. The PWM oscillator therefore cannot achieve duty cycles that would generate an excessive power at the output. The safety voltage value Vlim is given by the following expression:

$$Vlim = \frac{Vreg * \beta * Plim}{\beta * Plim + Rlim} - Vbe(Q1)$$

Vbe(Q1) is the voltage between the base and the emitter of Q1.

The parameter β is the coefficient that gives the resistance value of Plim, which is configured as a variable resistor. When β is set such that the first term in the equation above is less than or equal to the second term, the safety device is disabled and the control temperature is unlimited.

In a variant embodiment, the device supplies a signal VTout proportional to the control temperature. This signal copies the voltage across the terminals of the temperature sensor 10. This signal VTout allows a user to ascertain at any time the temperature of the component being regenerated. By default, VTout is output directly, i.e. at high impedance. If the application dictates a low-impedance signal, an optional impedance matcher 31 can be added, as in the example of FIG. 2. This impedance matcher, also known as a buffer, is composed of discrete components such as transistors, diodes, resistors and capacitors in order to ensure high resistance to radiation.

The components of the device according to the invention may all be mounted on the same printed circuit board with the exception of the temperature sensor 10 and the heating resistor 20, which are both thermally coupled to the component to be regenerated. The connections between the thermistor 10 and the heating resistor, and also the other components of the device, are wired. The connecting wires may be twisted in order to filter out the stray voltages induced by the environment.

The voltage regulator 1 may optionally be omitted from the device according to the invention, in which case the stabilized regulated voltage is supplied by an external voltage regulator.

In a variant embodiment, some or all of the discrete components of the device of FIGS. 1 and 2 may be replaced by an application-specific integrated circuit (ASIC) encompassing the functional blocks described above. In this case, supplementary adaptations to the various circuits that make up the device illustrated in FIG. 1 need to be provided.

The invention claimed is:

1. A device for regenerating electronic components exposed to ionizing radiation by heating them, wherein it comprises at least the following components:
   a heating resistor intended for heating a component to be regenerated;
   a thermistor connected to a current source and thermally coupled to said heating resistor, said thermistor, through which said current flows, having a voltage Vtemp across its terminals, which voltage reflects the temperature of said heating resistor, wherein the current source comprises:
      a balanced current mirror comprising four bipolar transistors,
   forming a full Wilson mirror;
      a resistor R6;
      a resistor Rshunt; and
      a resistor Rbias1, the four bipolar transistors together forming two simple current mirrors M1, M2 that are cascaded and cross-coupled such that the base currents of the four bipolar transistors cancel each other out, emitters of the four bipolar transistors of the first mirror M1 being able to be connected to a regulated voltage Vreg, output of the second mirror M2 being connected to the resistor Rshunt, which is connected to a resistor of said thermistor, and to the resistor Rbias1, which is connected to electrical ground, the resistor R6 connecting the emitters of the four bipolar transistors of the first mirror M1 to their common base;
   an error amplifier, which amplifies the difference between a setpoint voltage Vset and the voltage Vtemp and delivers a voltage Vctrl that corresponds to said amplified difference;
   a switch, which switches the current flowing through said heating resistor, wherein said switch controls a connection between said heating resistor and a DC supply voltage Vcc;
   an oscillator, which delivers a voltage Vosc formed with a modulated duty cycle, the duty cycle of the pulses of said voltage Vosc being dependent on the voltage Vctrl, said pulses controlling the opening of said switch; and
   a safety circuit connected to the oscillator.

2. The device as claimed in claim 1, wherein it comprises a setpoint module that delivers an adjustable voltage Vset, which reflects a heating setpoint temperature selected for said heating resistor.

3. The device as claimed in claim 1, wherein said components are embodied as discrete electronic components.

4. The device as claimed in claim 1, wherein it comprises a voltage regulator supplying a stabilized supply voltage to said current source, said amplifier and a setpoint module.

5. The device as claimed in claim 1, wherein the safety circuit is formed by a transistor Q1, a resistor Rlim and a potentiometer Plim, wherein the resistor Rlim and the potentiometer Plim are connected in the form of a divider bridge to a stabilized voltage Vreg supplied to said oscillator, a center tap of said divider bridge being connected to a base of the transistor Q1, an emitter of the transistor Q1 being connected to an input of said oscillator that receives the voltage Vctrl, and a collector being connected to said stabilized voltage Vreg.

6. The device as claimed in claim 1, wherein said switch comprises two bipolar transistors Q3, Q4 and resistors R7, R8, R9, R10, said transistors Q3, Q4 being put together such that when Q3 is on, Q4 is on, a base of Q4 being connected to a collector of the transistor Q3 via the resistor R9, the resistor R10 being connected between an emitter of Q4 and the base of Q4, the emitter of Q4 being directly connected to the DC supply voltage Vcc, and the collector of Q4 being directly connected to said heating resistor, an emitter of Q3 being connected to electrical ground, and a base of Q3 being connected to a center tap of a voltage divider composed of the resistors R7 and R8, the resistor R7 being connected to an output of said oscillator that delivers the voltage Vosc, and the resistor R8 being connected to electrical ground.

7. The device as claimed in claim 1, wherein a resistance value of the resistor R6 is approximately half a resistance value of the resistor Rbias1.

8. The device as claimed in claim 1, wherein said amplifier comprises at least:
   a first differential pair DP2 comprising complementary bipolar transistors, which forms a first amplification stage and receives the voltage Vtemp at a base of one transistor of DP2 and the voltage Vset at a base of the other transistor of DP2;
   a current mirror M4, which fixes a bias current of DP2;
   a second differential pair DP1 comprising complementary bipolar transistors, which forms a second amplification stage, a base of a first transistor of DP1 being connected to a collector of a first transistor of DP2, and a base of the second transistor of DP1 being connected to a collector of the second transistor of DP2;
   a current mirror M3, which fixes a bias current of DP1; and
   a bipolar transistor Q2, which forms a third amplification stage, a base of Q2 being connected to a collector of one transistor of DP1, a collector of Q2 being able to be connected to a regulated voltage Vreg, the voltage Vctrl being present at an output of an emitter of Q2.

9. The device as claimed in claim 8, wherein said error amplifier comprises resistors R1, R2, R3, R4, R5 and resistors Rbias2, Rbias3, emitters of transistors of the current mirror M3 being able to be connected to the regulated voltage Vreg, a collector of one transistor of the mirror M3 being connected to a resistor Rbias2, and a collector of the other transistor of the mirror M3 being connected to emitters of transistors of the first differential pair DP1, collectors of the mirror M3 being connected to ground via the resistors R3 and R4, emitters of the mirror M4 being connected to ground, one collector of said mirror M4 being able to be connected to the regulated voltage Vreg via a resistor Rbias3, and the other collector being connected to emitters of the differential pair DP2, the collectors of DP2 being connected to the regulated voltage Vreg, one via the resistor R1 and the other via the resistor R2, the collector of the transistor Q2 being able to be connected to the regulated voltage Vreg, the emitter of Q2 being connected to ground via the resistor R5.

10. The device as claimed in claim 1, wherein said oscillator comprises bipolar transistors Q5, Q6, Q7, Q8, resistors R11, R12, R13, R14, R15, R16, R17, R18, R19, R20, R21 and a capacitor C1, which are put together to form a relaxation oscillator, a free-running oscillation frequency being determined by the resistor R12 connected between said capacitor C1 and an emitter of Q8, which forms an output of said oscillator;
   a charging current of the capacitor C1 being controlled so as to modulate the duty cycle of the voltage Vosc delivered at the output of said oscillator, said charging current being supplied by the voltage Vctrl via the resistor R11;
   said oscillator being powered by a regulated voltage Vreg to which are connected the resistors R13, R14, R15, which are connected to a collector of Q5, Q6 and Q7, respectively, and a collector of the transistor Q8;

the transistors Q5 and Q6 and the resistors R13, R14, R16, R17 and R19 forming a Schmitt trigger-type flip-flop, a signal across terminals of said capacitor C1 being sent to a base of the transistor Q5 that constitutes the input of said Schmitt trigger-type flip-flop;

an output of said Schmitt trigger-type flip-flop, formed by a collector of Q6, being sent to an inverter formed by the transistor Q7 and the resistors R15, R18 and R20, R18 being connected between a base of Q7 and a collector of Q6, and R20 being connected between said base and electrical ground;

the signal being taken from the collector of the transistor Q7 and being sent to an impedance-matching stage composed of the transistor Q8, connected up as a follower, and the resistor R21, the transistor Q8 and the resistor R21 being configured in common-collector arrangement.

11. The device as claimed in claim 1, wherein it comprises an output that supplies a signal VTout that copies the voltage across the terminals of said thermistor.

12. A device for regenerating electronic components exposed to ionizing radiation by heating them, wherein it comprises at least the following components:
- a heating resistor intended for heating a component to be regenerated;
- a current source;
- a thermistor connected to said current source and thermally coupled to said heating resistor, said thermistor, through which said current flows, having a voltage Vtemp across its terminals, which voltage reflects the temperature of said heating resistor;
- an error amplifier, which amplifies the difference between a setpoint voltage Vset and the voltage Vtemp and delivers a voltage Vctrl that corresponds to said amplified difference, wherein the error amplifier comprises at least:
  - a first differential pair DP2 comprising complementary bipolar transistors, which forms a first amplification stage and receives the voltage Vtemp at a base of one transistor of DP2 and the voltage Vset at a base of the other transistor of DP2;
  - a current mirror M4, which fixes a bias current of DP2;
  - a second differential pair DP1 comprising complementary bipolar transistors, which forms a second amplification stage, a base of a first transistor of DP1 being connected to a collector of a first transistor of DP2, and a base of the second transistor of DP1 being connected to a collector of the second transistor of DP2;
  - a current mirror M3, which fixes a bias current of DP1;
  - a bipolar transistor Q2, which forms a third amplification stage, a base of Q2 being connected to a collector of one transistor of DP1, a collector of Q2 being able to be connected to a regulated voltage Vreg, the voltage Vctrl being present at an output of an emitter of Q2;
- a switch, which switches the current flowing through said heating resistor, wherein said switch controls a connection between said heating resistor and a DC supply voltage Vcc;
- an oscillator, which delivers a voltage Vosc formed with a modulated duty cycle, the duty cycle of the pulses of said voltage Vosc being dependent on the voltage Vctrl, said pulses controlling the opening of said switch; and
- a safety circuit connected to the oscillator.

13. A device for regenerating electronic components exposed to ionizing radiation by heating them, wherein it comprises at least the following components:
- a heating resistor intended for heating a component to be regenerated;
- a current source;
- a thermistor connected to said current source and thermally coupled to said heating resistor, said thermistor, through which said current flows, having a voltage Vtemp across its terminals, which voltage reflects the temperature of said heating resistor;
- an error amplifier, which amplifies the difference between a setpoint voltage Vset and the voltage Vtemp and delivers a voltage Vctrl that corresponds to said amplified difference;
- a switch, which switches the current flowing through said heating resistor, wherein said switch controls a connection between said heating resistor and a DC supply voltage Vcc;
- an oscillator, which delivers a voltage Vosc formed with a modulated duty cycle, the duty cycle of the pulses of said voltage Vosc being dependent on the voltage Vctrl, said pulses controlling the opening of said switch, wherein the oscillator comprises:
  - bipolar transistors Q5, Q6, Q7, Q8, resistors R11, R12, R13, R14, R15, R16, R17, R18, R19, R20, R21 and a capacitor C1, which are put together to form a relaxation oscillator, a free-running oscillation frequency being determined by the resistor R12 connected between said capacitor C1 and an emitter of Q8, which forms an output of said oscillator,
  - a charging current of the capacitor C1 being controlled so as to modulate the duty cycle of the voltage Vosc delivered at the output of said oscillator, said charging current being supplied by the voltage Vctrl via the resistor R11, the oscillator being powered by a regulated voltage Vreg to which are connected the resistors R13, R14, R15, which are connected to a collector of Q5, Q6 and Q7, respectively, and a collector of the transistor Q8,
  - the transistors Q5 and Q6 and the resistors R13, R14, R16, R17 and R19 forming a Schmitt trigger-type flip-flop, a signal across terminals of said capacitor C1 being sent to a base of the transistor Q5 that constitutes the input of said Schmitt trigger-type flip-flop,
  - an output of said Schmitt trigger-type flip-flop, formed by a collector of Q6, being sent to an inverter formed by the transistor Q7 and the resistors R15, R18 and R20, R18 being connected between a base of Q7 and a collector of Q6, and R20 being connected between said base and electrical ground, and
  - the signal being taken from the collector of the transistor Q7 and being sent to an impedance-matching stage composed of the transistor Q8, connected up as a follower, and the resistor R21, the transistor Q8 and the resistor R21 being configured in common-collector arrangement; and
- a safety circuit connected to the oscillator.

* * * * *